US008731101B2

(12) United States Patent
Senant et al.

(10) Patent No.: US 8,731,101 B2

(45) Date of Patent: May 20, 2014

(54) SYSTEM FOR AMPLIFYING SIGNALS GENERATED BY A SATELLITE SIGNAL GENERATOR UNIT

(75) Inventors: Eric Senant, Cessales (FR); Christian Peyrotte, Toulouse (FR); Charles Fernet, Labarthe sur Leze (FR)

(73) Assignee: Thales, Neuilly sur Seine (FR)

( * ) Notice: Subject to any disclaimer, the term of this patent is extended or adjusted under 35 U.S.C. 154(b) by 0 days.

(21) Appl. No.: 13/491,789

(22) Filed: Jun. 8, 2012

(65) Prior Publication Data

US 2013/0148700 A1 Jun. 13, 2013

(30) Foreign Application Priority Data

Jun. 10, 2011 (FR) .................................... 11 01782

(51) Int. Cl.
*H04B 7/14* (2006.01)

(52) U.S. Cl.
USPC ............................ 375/295; 375/296; 375/397

(58) Field of Classification Search
CPC ........................................................ H04B 7/14
USPC ................................. 375/211, 295, 296, 297
See application file for complete search history.

(56) References Cited

U.S. PATENT DOCUMENTS 5,732,107 A * 3/1998 Phillips et al. ................ 375/296
6,549,067 B1 * 4/2003 Kenington ...................... 330/52
6,934,341 B2 * 8/2005 Sahlman ....................... 375/297
7,042,283 B2 * 5/2006 Suzuki et al. ................... 330/52
7,170,344 B2 * 1/2007 Suzuki et al. ................. 330/149
7,471,739 B1 * 12/2008 Wright .......................... 375/297
7,539,464 B2 * 5/2009 Suzuki et al. ............. 455/114.3
7,738,597 B2 * 6/2010 Smaini et al. ................. 375/316
7,773,692 B2 * 8/2010 Copeland et al. ............. 375/297
7,804,915 B2 * 9/2010 Huang et al. .................. 375/296
8,036,306 B2 * 10/2011 Sorrells et al. ................ 375/297
8,059,748 B2 * 11/2011 See et al. ...................... 375/296
8,351,870 B2 * 1/2013 Sorrells et al. ................ 455/102
8,351,877 B2 * 1/2013 Kim et al. .................. 455/114.3
2003/0152139 A1 * 8/2003 Khorram ....................... 375/219
2004/0116083 A1 * 6/2004 Suzuki et al. ................ 455/126
2004/0189378 A1 * 9/2004 Suzuki et al. ................... 330/52
2005/0180527 A1 * 8/2005 Suzuki et al. ................ 375/297
2006/0276147 A1 * 12/2006 Suzuki et al. ............. 455/114.3
2008/0130789 A1 * 6/2008 Copeland et al. ............. 375/297
2008/0144709 A1 * 6/2008 McCallister et al. ......... 375/233
2008/0260066 A1 * 10/2008 Cai et al. ....................... 375/297
2010/0272214 A1 * 10/2010 Wurm et al. .................. 375/297
2012/0069931 A1 * 3/2012 Gandhi et al. ................ 375/296

FOREIGN PATENT DOCUMENTS

EP 1429453 A1 6/2004
FR 2722350 A1 1/1996

OTHER PUBLICATIONS

Search Report of corresponding French Application No. 1101782 issued on Mar. 2, 2012.

* cited by examiner

*Primary Examiner* — Daniel Washburn
*Assistant Examiner* — Berhanu Tadese
(74) *Attorney, Agent, or Firm* — Baker Hostetler LLP

(57) ABSTRACT

A system for amplifying signals generated by a unit for generating signals of a satellite, the system including: a first pathway including a first bandpass digital filter with finite impulse response and a first digital/analog converter; frequency transposition means; an amplifying device; a second pathway including a second bandpass digital filter with finite impulse response; gain means disposed at the output of said second digital filter, a phase-slaved numerically-controlled oscillator, and a second digital/analog converter; and a recombiner device for summing the signals of said first and second pathways.

4 Claims, 1 Drawing Sheet

SYSTEM FOR AMPLIFYING SIGNALS GENERATED BY A SATELLITE SIGNAL GENERATOR UNIT

CROSS-REFERENCE TO RELATED APPLICATIONS

This application claims priority to foreign French patent application No. FR 11 01782, filed on Jun. 10, 2011, the disclosure of which is incorporated by reference in its entirety.

FIELD OF THE INVENTION

The present invention pertains to a system for amplifying signals generated by a satellite signals generation unit.

BACKGROUND

The satellites amplifying systems, for example communication or navigation satellites, are used in their zone of optimal efficiency, giving rise, in fact, to a power response that turns out to be non-linear.

These non-linearities cause power spread (inter-modulation products) that are outside of the useful band, or "spurious", that have to be filtered at high power, so as to adhere to frequency regulations.

Hence, the implementation of such processing increases and complicates the payload of the satellite, both in terms of mass and volume.

Techniques are known for linearizing the amplifier by use of signal digital predistortion, at generation of the signal, such as illustrated for example by in U.S. Pat. No. 6,549,067 B1, the disclosure of which is incorporated by reference in its entirety.

Such embodiments impose a high bandwidth for the RF stage or radiofrequency stage, thus entailing a strong impact in terms of payload of the satellite.

Techniques are also known based on hardware linearizers carrying out compensation of the non-linearities at the input of an amplifying device by emulation, in phase opposition of the non-linearities, power-wise, notably by means of diodes, such as illustrated for example by the French Patent Application Pub. No. FR 2 722 350 A1, the disclosure of which is incorporated by reference in its entirety.

Such embodiments are rather ineffective for the transistor-based amplifiers commonly employed on satellites.

SUMMARY

An aim of the invention is to alleviate the problems cited above.

There is proposed, according to one aspect of the invention, a system for amplifying signals generated by a satellite signal generator unit, comprising:

- a first pathway comprising a first bandpass digital filter, with finite impulse response, for filtering outside the useful band, of the digital signals generated by said unit and a first digital/analog converter disposed at the output of said first digital filter,
- frequency transposition means for converting a signal in baseband or in intermediate frequency into a signal in carrier band, and
- an amplifying device comprising a pre-amplifier and an amplifier,
- a second pathway comprising a second bandpass digital filter with finite impulse response for filtering outside of its useful band digital signals generated by said unit, gain means disposed at the output of said second digital filter, a phase-slaved numerically-controlled oscillator disposed at the output of said gain means, and a second digital/analog converter disposed at the output of said numerically-controlled oscillator, and
- a recombiner device for summing the signals of said first and second pathways.

Such a system makes it possible to concentrate the effectiveness of the method on the frequency band impacted by the phenomenon of non-linearities, and not in a global manner as proposed by the existing solutions. This therefore potentially allows a simplification of the complete chain by removal of the high-power output filtering.

According to one embodiment, said frequency transposition means are disposed between the output of said recombiner device and the input of said amplifying device.

In this case, a single frequency transposition and amplifying device are required at one and the same time for the useful signal and the compensation signal.

In one embodiment, said frequency transposition means comprise a local oscillator, a mixer adapted for adding frequency-wise, by multiplication, the input signal of said frequency transposition means and the output signal of the local oscillator, and a third analog bandpass filter for isolating the result of said multiplication.

According to another embodiment, said frequency transposition means comprise:

- first frequency transposition sub-means disposed on the first pathway between the output of said first converter and the input of said summator, and
- second frequency transposition sub-means disposed on the second pathway between the output of said second converter (CNA2) and the input of said summator.

In this case, the useful bandwidth of the frequency transposition device dedicated to the useful signal (first pathway) may be limited to the useful band of the signal.

In one embodiment, said first and/or second frequency transposition sub-means comprise respectively a local oscillator, a mixer adapted for adding frequency-wise, by multiplication, the input signal of said frequency transposition sub-means and the output signal of the local oscillator, and a third analog bandpass filter for isolating the result of said multiplication.

Thus, the compensation signal may be linearly amplified, thereby simplifying the slaving of this compensation.

According to another aspect of the invention, there is also proposed a method for amplifying signals of a satellite, comprising the steps consisting in:

- on a first pathway, digitally filtering the signals emitted so as to eliminate the off-useful-band parts and converting the digital signals obtained into analog signals,
- on a second pathway, digitally filtering the signals emitted so as to eliminate the off-useful-band parts, applying a gain to the digital signals obtained, synchronizing said signals in coherence with the signals of said first pathway, and converting the digital signals obtained into analog signals,
- summing the signals of said first and second pathways,
- performing a frequency transposition so as to convert a signal in baseband or in intermediate frequency into a signal in carrier band, and
- amplifying the signals before emission.

BRIEF DESCRIPTION OF THE DRAWINGS

The invention will be better understood on studying a few embodiments described by way of wholly non-limiting examples and illustrated by the appended drawings in which.

In all the figures, elements having the same references are similar.

DETAILED DESCRIPTION

Figure 1:
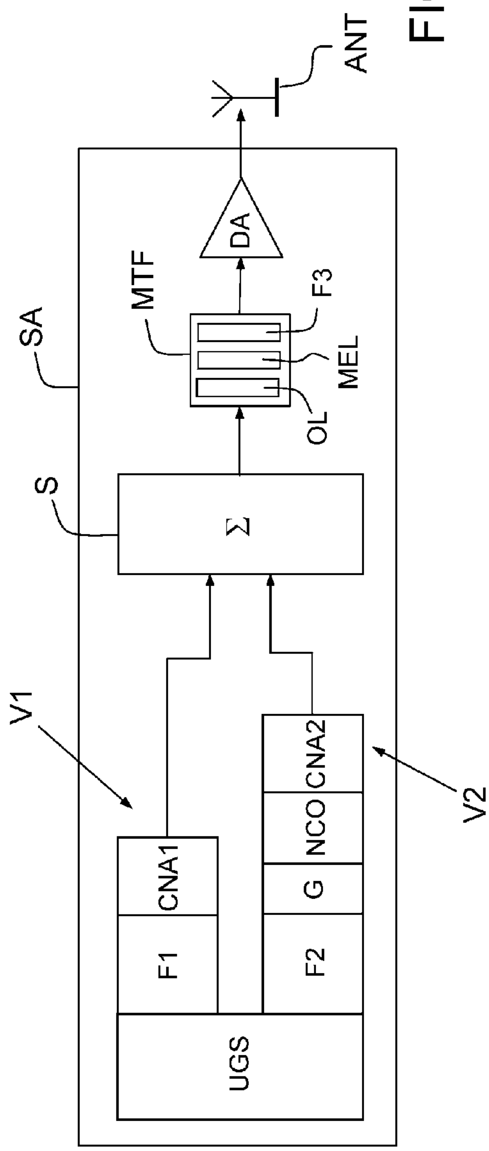
FIG. 1 schematically illustrates an embodiment of a system for amplifying signals generated by a satellite signals generation unit, according to one aspect of the invention.

FIG. 1 schematically illustrates a system SA for amplifying signals generated by a signal generation unit UGS of a satellite. The amplifying system SA comprises a first pathway V1 furnished with a first bandpass digital filter F1 with finite impulse response for filtering outside of its useful band digital signals generated by the unit UGS, and a first digital/analog converter CNA1 disposed at the output of said first digital filter F1. The amplifying system SA also comprises a frequency transposition module MTF for converting a signal in baseband or in intermediate frequency into a signal in carrier band, and an amplifying device DA comprising a pre-amplifier and an amplifier.

The amplifying system SA comprises, furthermore, a second pathway V2 comprising a second bandpass digital filter F2 with finite impulse response for filtering outside of the useful band, digitally generated by the unit UGS, a gain module G disposed at the output of said second digital filter F2, a phase-slaved numerically-controlled oscillator NCO disposed at the output of the gain module G, and a second digital/analog converter CNA2 disposed at the output of the numerically-controlled oscillator NCO, and a recombiner device S for summing the signals of the first and second pathways V1, V2.

The frequency transposition module MTF is disposed between the output of the recombiner device S and the input of the amplifying device DA.

In this instance, the frequency transposition module MTF comprises a local oscillator OL, a mixer MEL adapted for adding frequency-wise, by multiplication, the input signal of the frequency transposition module MTF and the output signal of the local oscillator OL, and a third analog bandpass filter F3 for isolating the result of said multiplication.

The local oscillator OL defines the carrier frequency at which the recombined signal will be modulated. The analog bandpass filter F3 makes it possible to limit the input of the amplifying device DA to the useful band of the signal, including the compensation.

The embodiment of FIG. 1 exploits the optional ability of the module MTF to manage at one and the same time the useful signal and the compensation signal.

Figure 2:
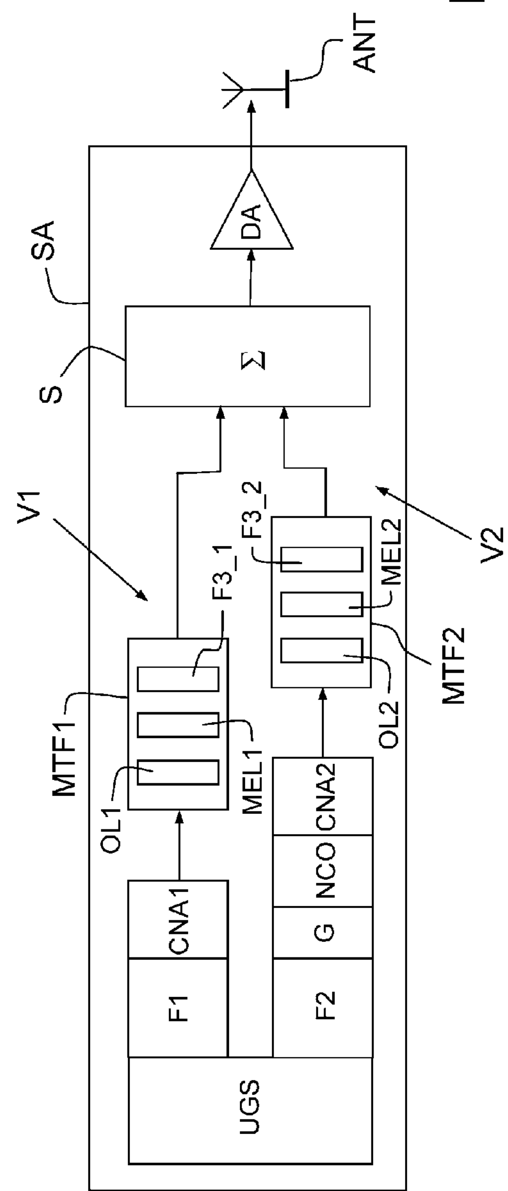
FIG. 2 schematically illustrates another embodiment of a system for amplifying signals generated by a satellite signal generation unit, according to one aspect of the invention.

FIG. 2 schematically illustrates a system SA for amplifying signals generated by a unit for generating signals UGS of a satellite. The amplifying system SA comprises a first pathway V1 furnished with a first bandpass digital filter F1 with finite impulse response for filtering outside of the useful band digital signals generated by the unit UGS, and a first digital/analog converter CNA1 disposed at the output of said first digital filter F1. The amplifying system SA also comprises a frequency transposition module MTF for converting a signal in baseband or in intermediate frequency into a signal in carrier band, and an amplifying device DA comprising a pre-amplifier and an amplifier.

The amplifying system SA comprises, furthermore, a second pathway V2 comprising a second bandpass digital filter F2 with finite impulse response for filtering outside of its useful band digital signals generated by the unit UGS, a gain module G disposed at the output of said second digital filter F2, a phase-slaved numerically-controlled oscillator NCO disposed at the output of the gain module G, and a second digital/analog converter CNA2 disposed at the output of the numerically-controlled oscillator NCO, and a recombiner device S for summing the signals of the first and second pathways V1, V2.

The frequency transposition module MTF comprises a frequency transposition module MTF comprising:

- a first frequency transposition sub-module MTF1 disposed on the first pathway V1 between the output of the first converter CNA1 and the input of the summator S, and
- a second frequency transposition sub-module MTF2 disposed on the second pathway V2 between the output of the second converter CNA2 and the input of the summator S.

The first and/or second frequency transposition sub-modules MTF1, MTF2 comprise respectively a local oscillator OL1, OL2, a mixer MEL1, MEL2 adapted for adding frequency-wise, by multiplication, the input signal of the frequency transposition sub-modules MTF1, MTF2 and the output signal of the local oscillator OL1, OL2, and a third analog bandpass filter F3_1, F3_2 for isolating the result of said multiplication, thereby making it possible to limit the spectral occupancy of the signals at the input of the amplifying device DA.

The embodiment of FIG. 2 simplifies the slaving in terms of gain and synchronization of the compensation signal.

Finally, it should be noted that the language used in the specification has been principally selected for readability and instructional purposes, and may not have been selected to delineate or circumscribe the inventive subject matter. Accordingly, the disclosure of the present invention is intended to be illustrative, but not limiting, of the scope of the invention.

The invention claimed is:

1. A system for amplifying signals generated by a unit for generating signals of a satellite, said system comprising:
   - a first pathway comprising:
     - a first bandpass digital filter with a finite impulse response for filtering digital signals generated by said unit outside of a useful band of the first bandpass digital filter, and
     - a first digital/analog converter disposed at an output of said first bandpass digital filter;
   - frequency transposition means for converting a signal in baseband or in an intermediate frequency to a signal in a carrier band;
   - an amplifying device comprising a pre-amplifier and an amplifier;
   - a second pathway comprising:
     - a second bandpass digital filter with a finite impulse response for filtering digital signals generated by said unit outside of a useful band of the second bandpass digital filter,
     - gain means disposed at an output of said second bandpass digital filter,
     - a phase-slaved numerically-controlled oscillator disposed at an output of said gain means, and
     - a second digital/analog converter disposed at an output of said phase-slaved numerically-controlled oscillator; and
   - a recombiner device configured to sum output signals of said first and second pathways, wherein said frequency transposition means comprise:

first frequency transposition sub-means disposed on the first pathway between an output of said first digital/analog converter and an input of said recombiner device; and second frequency transposition sub-means disposed on the second pathway between an output of said second digital/analog converter and an input of said recombiner device.

2. The system as claimed in claim 1, wherein said frequency transposition means are disposed between an output of said recombiner device and an input of said amplifying device.

3. The system as claimed in claim 2, wherein said frequency transposition means comprise:

a local oscillator;

a mixer configured to add, frequency-wise and by multiplication, an input signal of said frequency transposition means and an output signal of the local oscillator; and a third analog bandpass filter for isolating an output signal of said mixer.

4. The system as claimed in claim 1, wherein said first or second frequency transposition sub-means comprise:

a local oscillator;

a mixer configured to add, frequency-wise and by multiplication, an input signal of said first or second frequency transposition sub-means and an output signal of the local oscillator; and a third analog bandpass filter for isolating an output signal of said mixer.

* * * * *